US008772892B2

(12) United States Patent
Okigawa

(10) Patent No.: US 8,772,892 B2
(45) Date of Patent: Jul. 8, 2014

(54) SOLID STATE IMAGING DEVICE

(71) Applicant: FUJIFILM Corporation, Tokyo (JP)

(72) Inventor: Mitsuru Okigawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/773,859

(22) Filed: Feb. 22, 2013

(65) Prior Publication Data

US 2013/0161774 A1 Jun. 27, 2013

Related U.S. Application Data

(63) Continuation of application No. PCT/JP2011/067642, filed on Aug. 2, 2011.

(30) Foreign Application Priority Data

Aug. 24, 2010 (JP) .................................. 2010-187214
Jun. 14, 2011 (JP) .................................. 2011-132055

(51) Int. Cl.
*H01L 27/146* (2006.01)
*H01L 31/0232* (2014.01)

(52) U.S. Cl.
CPC ...... *H01L 27/14627* (2013.01); *H01L 31/0232* (2013.01)
USPC ............. 257/432; 257/E27.129; 257/E31.127

(58) Field of Classification Search
CPC ...................... H01L 27/14627; H01L 31/0232
USPC .............. 257/432, E27.129, E31.127; 438/65
See application file for complete search history.

(56) References Cited

U.S. PATENT DOCUMENTS

| | | | |
|---|---|---|---|
| 6,829,008 B1 | 12/2004 | Kondo et al. | |
| 8,102,460 B2* | 1/2012 | Awazu | 348/340 |
| 2010/0128152 A1* | 5/2010 | Hayasaka et al. | 348/280 |
| 2010/0238330 A1* | 9/2010 | Hirota | 348/273 |
| 2013/0021499 A1* | 1/2013 | Ui et al. | 348/238 |
| 2013/0181114 A1* | 7/2013 | Egawa | 250/208.1 |
| 2013/0182155 A1* | 7/2013 | Egawa | 348/294 |

FOREIGN PATENT DOCUMENTS

| | | |
|---|---|---|
| JP | 59-33409 A | 2/1984 |
| JP | 11-211971 A | 8/1999 |
| JP | 2000-156823 A | 6/2000 |
| JP | 2007-65330 A | 3/2007 |
| JP | 2007-103590 A | 4/2007 |
| JP | 2007-281296 A | 10/2007 |
| JP | 2008-71920 A | 3/2008 |
| JP | 2008-211631 A | 9/2008 |
| JP | 2008-241872 A | 10/2008 |

* cited by examiner

*Primary Examiner* — Allan R Wilson
(74) *Attorney, Agent, or Firm* — Birch, Stewart, Kolasch & Birch, LLP

(57) ABSTRACT

A CCD image sensor is provided with a pixel set. The pixel set is composed of first and second pixels and a microlens. The pixels are arranged side by side in a horizontal direction. The microlens has a hemispheric shape. A diameter of the microlens is larger than a length of a rectangular region, being an external shape of the first and second pixels, in a height direction. The rectangular region has a height and width ratio of approximately 1:2. The pixel sets are arranged in a width direction of the rectangular region to constitute a pixel row. In the CCD image sensor, the pixel rows are arranged in the height direction of the rectangular region, with the adjacent pixel rows shifted from each other in the horizontal direction by half pitch of the rectangular region.

14 Claims, 15 Drawing Sheets

SOLID STATE IMAGING DEVICE

CROSS REFERENCE TO RELATED APPLICATIONS

This non-provisional application is a Continuation of International Application No. PCT/JP2011/067642 filed on Aug. 2, 2011, which claims the benefit of Japanese Patent Application Nos. 2010-187214 filed in Japan on Aug. 24, 2010 and 2011-132055 filed in Japan on Jun. 14, 2011. The entire contents of all of the above applications are hereby incorporated by reference.

BACKGROUND OF THE INVENTION

1. Field of the Invention

The present invention relates to a solid state imaging device capable of automatic focus detection of a phase difference method and capturing parallax images for stereoscopy.

2. Description Related to the Prior Art

A solid state imaging device capable of automatic focus detection of a phase difference method (hereinafter referred to as the phase difference AF) in addition to imaging of a subject image is known (see Japanese Patent Laid-Open Publication No. 59-033409 and U.S. Pat. No. 6,829,008 corresponding to Japanese Patent Laid-Open Publication No. 2000-156823). The solid state imaging device for the phase difference AF has a plurality of phase difference detection pixels arranged in a predetermined pattern in an imaging surface. In each phase difference detection pixel, an optical axis of a microlens that condenses light into a photodiode (PD) and a center of an opening formed through a light shielding film covering the PD are shifted in a rightward or leftward direction. Thereby, the PD selectively receives the light from the rightward or leftward direction depending on the incident angle.

In the solid state imaging device of the phase difference AF, when a subject image formed on the imaging surface through an imaging optical system is out of focus, there is a positional shift between an image produced using the phase difference detection pixels which selectively receive the light from the rightward direction and an image produced using the phase difference detection pixels which selectively receive the light from the leftward direction. A defocusing amount of the imaging optical system is obtained from an amount of the positional shift, and the imaging optical system is moved accordingly. Thus, the phase difference AF is performed.

Recently, a solid state imaging device having only the phase difference detection pixels arranged in the imaging surface has been suggested. In the solid state imaging device, a right-eye image (R viewpoint image) is produced using the phase difference detection pixels which selectively receive the light from the rightward direction. A left-eye image (L viewpoint image) is produced using the phase difference detection pixels which selectively receive the light from the leftward direction. Thereby, a pair of R and L viewpoint images (hereinafter referred to as the parallax images) causing binocular parallax are obtained. Generally, to capture the parallax images, two pairs of taking lenses and solid state imaging devices are disposed parallel with each other. The above-configured solid state imaging device, on the other hand, only needs a pair of taking lens and solid state imaging device. Thus, the parallax images are captured with a simple configuration.

When the phase difference detection pixel is formed by shifting the opening of the light shielding film, the size of the opening needs to be reduced in accordance with the amount of the shift. Hence, the sensitivity of the phase difference detection pixel is reduced as compared with that of a normal pixel in which the optical axis of the microlens is coincident with the center of the opening of the light shielding film. There is another type of the phase difference detection pixel in which the optical axis of the microlens is shifted relative to the center of the light receiving surface of the PD. In this case, a diameter of the microlens is reduced so as to prevent the light from being incident on the adjacent pixel. This configuration also reduces the sensitivity of the phase difference detection pixel. It is thus necessary to improve the sensitivities of the phase difference detection pixels in the solid state imaging device.

SUMMARY OF THE INVENTION

An object of the present invention is to provide a solid state imaging device having phase difference detection pixels with improved sensitivities.

To achieve the above and other objects, a solid state imaging device comprises a plurality of pixel sets, pixel rows, and an imaging surface. Each pixel set includes N (N is an integer greater than or equal to two) pixels and a microlens. Each pixel has a photoelectric converter for accumulating charge in accordance with incident light. The microlens condenses light into each of the N pixels. The N pixels are arranged in a rectangular region with a height and width ratio of approximately 1:2 such that each of the photoelectric converters is line-symmetric or rotationally symmetric with respect to a center of the rectangular region in a width direction. An optical axis of the microlens is substantially coincident with the center of the rectangular region. The size of the microlens is larger than a length of the rectangular region in a height direction and smaller than a length of the rectangular region in a width direction. The each pixel row is composed of the pixel sets arranged in the width direction. The pixel rows are arranged in the height direction in the imaging surface. The adjacent pixel rows are shifted from each other by half the rectangular region in the width direction. The portion of the microlens extending beyond the rectangular region overlaps a space between the two microlenses of the two adjacent pixel sets in the adjacent pixel row.

It is preferable that the pixel rows extend in a horizontal direction of the imaging surface and the microlenses are arranged in a 45-degree oblique direction.

It is preferable that the pixel set has a color filter, and the color filters are arranged adjacent to each other in the 45-degree oblique direction in the imaging surface in a manner similar to the microlenses.

It is preferable that the color filters include red color filters for transmitting red light, green color filters for transmitting green light, and blue color filters for transmitting blue light. The color filters of three colors are classified into first filter sets and second filter sets. The each first filter set is composed of the two green color filters arranged adjacent to each other in the 45-degree oblique direction and the two red color filters arranged adjacent to each other in the 45-degree oblique direction and adjacent to the respective green color filters. The each second filter set is composed of the first filter set with the red color filters replaced by the blue color filters. It is preferable that the first and second filter sets are arranged in a checkered pattern in the imaging surface.

It is preferable that the color filter has a square shape rotated by approximately 45 degrees, and a diagonal line of the square shape is approximately equivalent to the length of the rectangular region in the width direction, and a center of the color filter is coincident with the optical axis of the microlens.

It is preferable that the N is two, and the each pixel has a square shape, and the pixels are arranged adjacent to each other in the horizontal and vertical directions in a simple square lattice pattern in the imaging surface.

It is preferable that the pixel rows extend in a 45-degree oblique direction of the imaging surface, and the microlenses are arranged adjacent to each other in horizontal and vertical directions.

It is preferable that the N is two, and the two pixels each having a square shape are arranged adjacent to each other in the 45-degree oblique direction.

It is preferable that the photoelectric converter of the each pixel in the pixel set or an opening of a light shielding film of the each pixel is shifted close to a center of the microlens.

It is preferable that the N is 3 to 5, and the pixel rows extend in the width direction of the rectangular region.

It is preferable that the N pixels are first to fifth pixels. The first pixel is disposed in the middle of the rectangular region, and the second and third pixels are arranged in two rows, top-and-bottom, on a right side of the first pixel, and the fourth and fifth pixels are arranged in two rows, top-and-bottom, on a left side of the first pixel.

It is preferable that the microlens has a substantially hemispheric shape with a diameter of $\sqrt{2}A$ where the length of the rectangular region in the height direction is A.

It is preferable that the microlens has a convex surface with a substantially square external shape.

It is preferable that the microlens has a semi-ellipsoidal shape whose length of the major axis is substantially equal to a length of the pixel set in the width direction, and the optical axis of the microlens is substantially coincident with the center of the rectangular region.

According to the present invention, one microlens is provided to cover two or more pixels. Each of the pixels is used as the phase difference detection pixel. A diameter or a maximum width of the microlens is larger than the length of the rectangular region, provided with the photoelectric converters of the respective pixels, in the height direction. The pixel sets are arranged to constitute the imaging surface such that a portion of the microlens extending beyond the region overlaps a space between the microlenses of the two adjacent pixel sets of the adjacent pixel rows. Thereby, the diameter of the microlens is increased as compared with the phase difference detection pixel formed by shifting the opening of the light shielding film. Thus, the sensitivities of the pixels, being the phase difference detection pixels, are increased.

BRIEF DESCRIPTION OF THE DRAWINGS

The above and other objects and advantages of the present invention will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS

Figure 1:
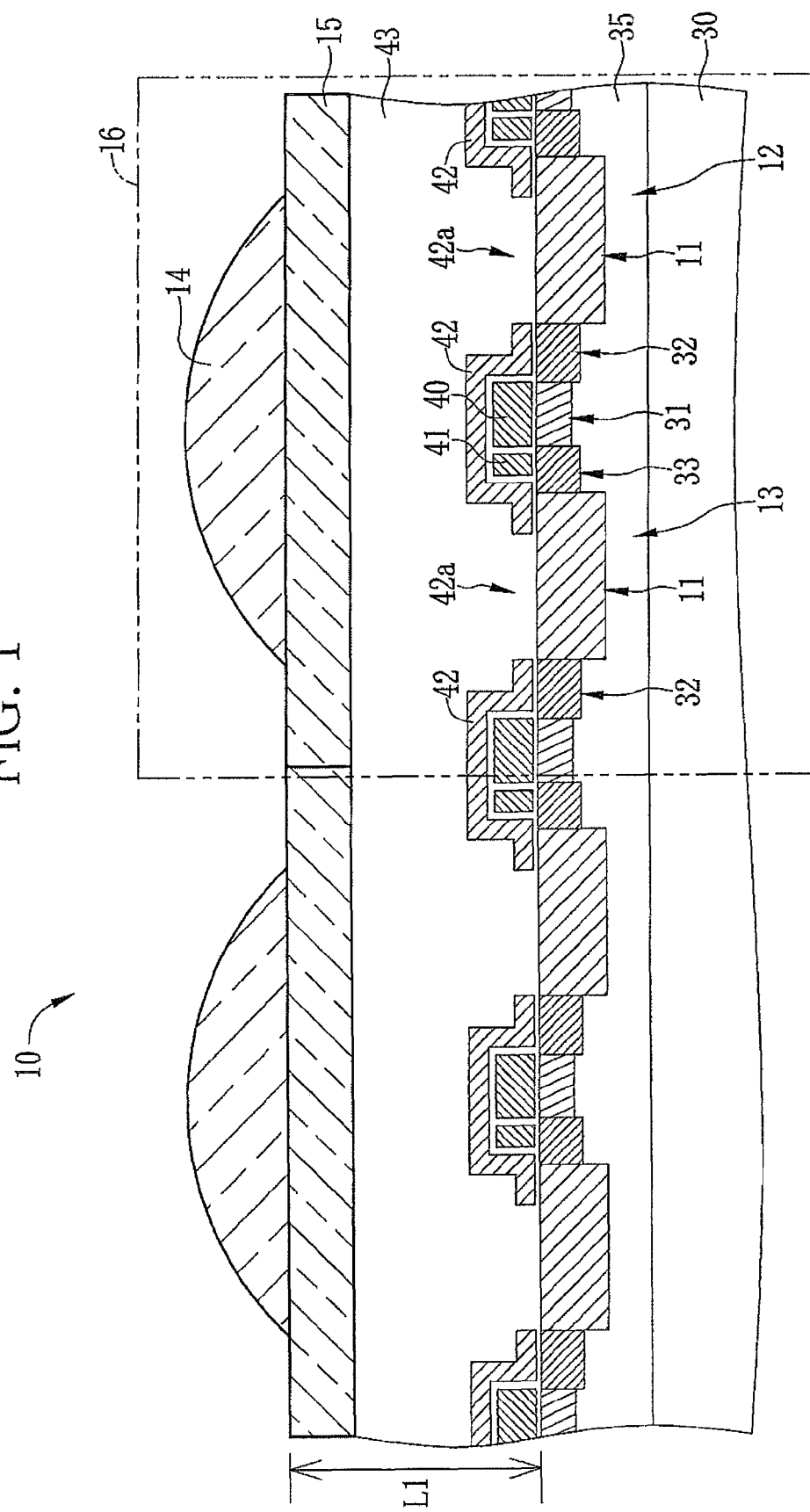
FIG. 1 is a schematic cross-sectional view of a CCD image sensor.
Figure 2:
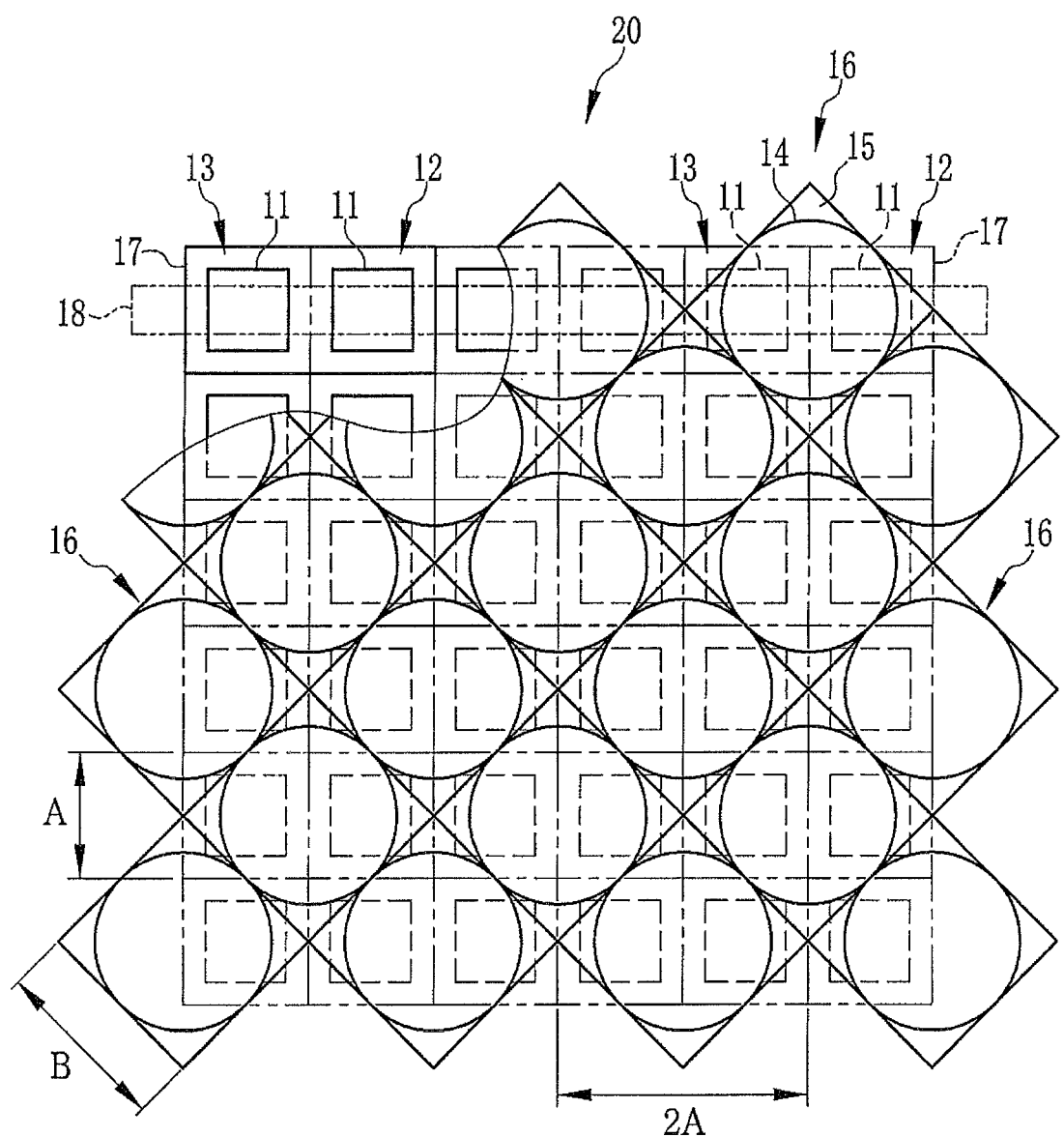
FIG. 2 is an explanatory view illustrating a configuration of an imaging surface.

As shown in FIGS. 1 and 2, a CCD image sensor 10, being a solid state imaging device, is provided with pixel sets 16. Each pixel set 16 is composed of two pixels, first and second pixels 12 and 13 with respective photodiodes (PDs) 11, a microlens 14, and a color filter 15. The PD 11 is a photoelectric converter that converts incident light into charge and accumulates the charge. The pixels 12 and 13 are arranged side by side in a horizontal direction. The microlens 14 is disposed to correspond to the pixels 12 and 13. The microlens 14 condenses light into the pixels 12 and 13. The color filter 15 is disposed between the microlens 14 and the pixels 12 and 13. The color filter 15 transmits only the light of a particular color (wavelengths), out of the light condensed by the microlens 14, to the pixels 12 and 13.

The pixels 12 and 13 have square shapes of the same size. The pixels 12 and 13 are disposed to be in contact with each other in an imaging surface 20 (see FIG. 2). The PD 11 has a square shape. Centers of the PDs 11 coincide with respective centers of the pixels 12 and 13. A region 17 of the pixel set 16 over a semiconductor substrate has a rectangular shape with a height and width ratio of approximately 1:2. The PD 11 of each of the pixels 12 and 13 is line-symmetric with respect to a center of the region 17 in a width (longitudinal) direction. Note that, more precisely, the shape of the PD 11 refers to the shape of the PD 11 exposed through an opening of a light shielding film.

The microlens 14 has a hemispheric shape. The microlens 14 is disposed such that its optical axis coincides with a midpoint between the pixels 12 and 13, that is, the center of the region 17. The microlens 14 may be composed of two conventional microlenses combined together by moving each of the conventional microlenses by A/2 and enlarged. Here, "A" denotes the length of the region 17 in a height direction orthogonal to the longitudinal direction. Note that the conventional microlens refers to the microlens with the optical axis coinciding with the center of the PD 11 and having the diameter approximately equivalent to the region of the corresponding pixel.

The square-shaped color filter (color filter segment) 15 is rotated by 45 degrees and disposed such that the center of the color filter 15 coincides with the optical axis of the microlens 14. A length of a diagonal line of the color filter 15 is 2A, that is, the length of the region 17 in the width direction. The microlens 14 has the size of an inscribed circle of the color filter 15. These are the maximum sizes for the microlens 14 and the color filter 15 to allow the pixel sets 16 to be adjacent to each other.

When the color filter 15 has a square shape, a length B of each side is $\sqrt{2}A$, and an area of the color filter 15 is $2A^2$. Namely, the area of the color filter 15 is twice the area of each of the pixels 12 and 13. The length B of each side of the color filter 15 is equivalent to the diameter of the microlens 14. Accordingly, an area of an external circle (a circle with a diameter B) of the microlens 14 is $\pi A^2/2$. An area of the external circle of the conventional microlens with the diameter A is $\pi A^2/4$. Thus, the area of the external circle of the microlens 14 of the pixel set 16 is twice the area of the external circle of the conventional microlens.

Figure 3:
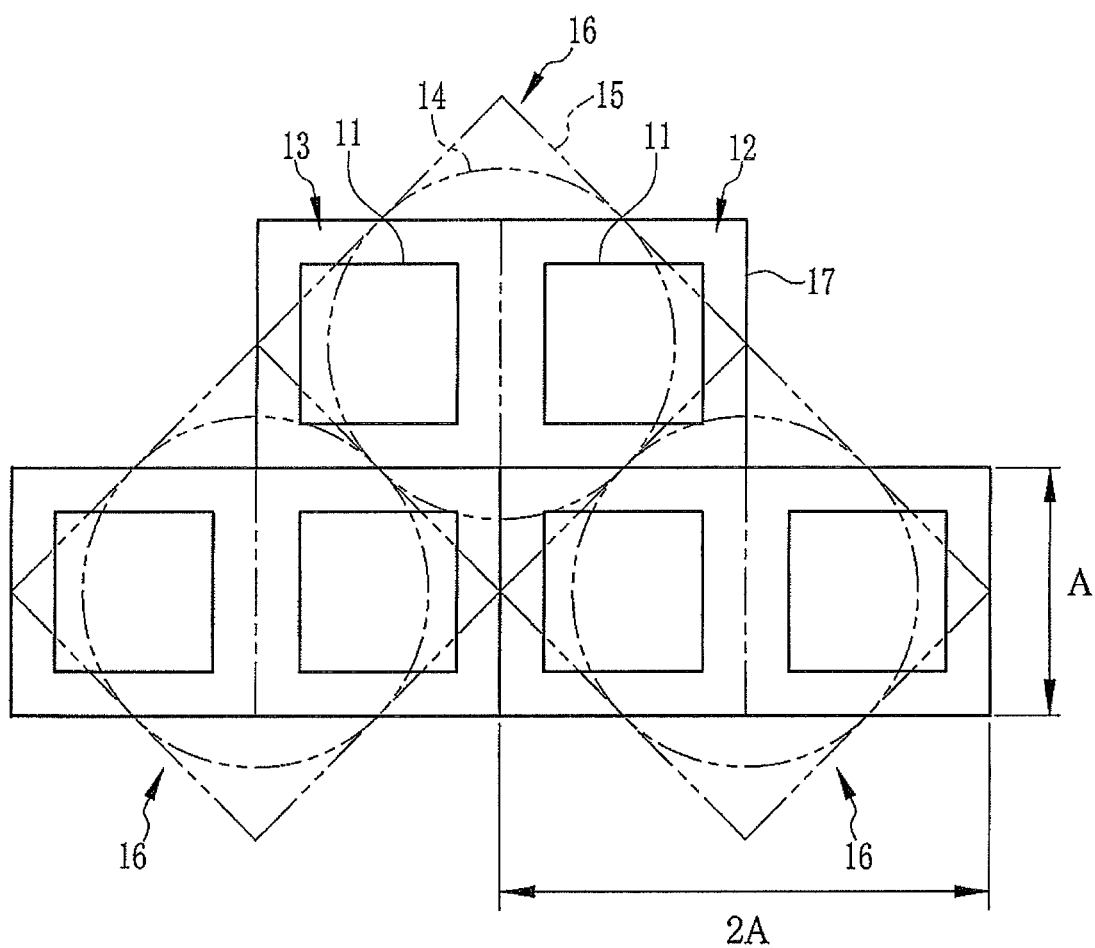
FIG. 3 is an explanatory view illustrating a configuration of a pixel set.

In the CCD image sensor 10, the pixel sets 16 are disposed in the width direction such that the width direction (longitudinal direction) of the region 17 of the pixel set 16 is parallel with the horizontal direction. Thereby, the pixel sets 16 constitute a pixel row 18. As shown in FIGS. 2 and 3, in the CCD image sensor 10, the pixel rows 18 are arranged in the height direction (vertical direction) of the region 17. One of the adjacent pixel rows 18 is shifted from the other by half pitch of the region 17 to prevent the pixels of the same type (the first pixels 12 or the second pixels 13) from being adjacent to each other.

In the CCD image sensor 10, the pixel rows 18 thus arranged constitute the rectangular imaging surface 20 for imaging a subject. Note that FIG. 2 illustrates the imaging surface 20 composed of 18 pixel sets 16 arranged in 3×6 by way of example. Actually, the imaging surface 20 is composed of a plurality of pixel sets 16, as is well-known.

When the pixel rows 18 are arranged in the vertical direction, the pixels 12 and 13 are arranged in a simple square lattice pattern in which the pixels 12 and 13 are adjacent to each other in horizontal and vertical directions. Similar to the case where the pixels are arranged in a so-called honeycomb pattern, the microlenses 14 are arranged adjacent to each other in a 45-degree oblique direction and the color filters 15 are arranged adjacent to each other in the 45-degree oblique direction. Here, the horizontal direction is a right-left direction of the rectangular imaging surface 20. The vertical direction is an up-down direction of the imaging surface 20. The 45-degree oblique direction is a direction 45 degrees oblique to the right-left direction of the imaging surface 20.

The adjacent pixel rows 18 are shifted from each other by the half pitch of the region 17, that is, by a pixel in the horizontal direction. Thereby, a portion of the microlens 14 extending beyond the region 17 in an upward or downward direction overlaps a space between the microlenses 14 of the adjacent pixel sets 16 in the adjacent pixel row 18. A portion of the color filter 15 extending beyond the region 17 in the upward or downward direction overlaps a space between the color filters 15 of the adjacent pixel sets 16 in the adjacent pixel row 18. Thereby, in the CCD image sensor 10, the pixels 12 and 13 are arranged without any gap in the horizontal and vertical directions. The microlenses 14 and the color filters 15 are formed without any gap in the 45-degree oblique direction.

In FIG. 3, in the pixel set 16, each of the pixels 12 and 13 receives the light selectively, depending on a light incident angle. To be more specific, it is difficult for the light incident on the microlens 14 from a rightward direction to be incident on the first pixel 12 located on the right side relative to the optical axis of the microlens 14. It is difficult for the light incident on the microlens 14 from the leftward direction to be incident on the second pixel 13 located on the left side relative to the optical axis of the microlens 14. Hence, a left-eye image (L-viewpoint image) is incident on the first pixels 12. A right-eye image (R-viewpoint image) is incident on the second pixels 13.

Each of the pixel sets 16 uses one microlens 14. The microlens 14 is disposed such that its optical axis is shifted in one direction relative to the center of the PD 11 of the pixel 12, and in the other direction opposite to the one direction relative to the center of the PD 11 of the pixel 13. Thereby, the pixels 12 and 13 function as phase difference detection pixels. To be more precise, when a focal length of the microlens 14 is substantially the same as a distance L1 (see FIG. 1) between the microlens 14 and the opening of the light shielding film, the above-described right-and-left relationship is maintained. The opening of the light shielding film determines a light incident area of the PD 11. Note that the focal length of the microlens 14 is set to the distance L1 so as to condense the incident light into the opening.

When the CCD image sensor 10 is used in an image recording device such as a digital camera, the left-eye image and the right-eye image are shifted from each other in the right-left direction depending on a focal state of a taking lens that forms a subject image on the CCD image sensor 10. The left-eye image is composed of an image signal from the first pixels 12 in the imaging surface 20. The right-eye image is composed of an image signal from the second pixels 13 in the imaging surface 20.

The focal state of the taking lens is detected by detection of an amount and a direction of the shift between the image composed of the image signal from the first pixels 12 and the image composed of the image signal from the second pixels 13.

Thereby, the CCD image sensor 10 performs the phase difference AF with the use of the left-eye image, produced using the first pixels 12, and the right-eye image, produced using the second pixels 13. With the use of the first and second pixels 12 and 13, the CCD image sensor 10 is also capable of obtaining a pair of images causing binocular parallax, that is, so-called monocular 3D imaging.

The CCD image sensor 10 is formed over an n-type semiconductor substrate 30. The n-type semiconductor substrate 30 is provided with vertical transfer paths (VCCDs) 31 and element isolators 32. The vertical transfer path (VCCD) 31 transfers the charge, accumulated by the PDs 11, in the vertical direction. The element isolator 32 isolates the pixels 12 and 13 from each other so as not to transfer the charge between the adjacent pixels 12 and 13.

The VCCD 31 and the element isolator 32 are provided for each column of the PDs 11. The VCCD 31 is connected to each of the corresponding PDs 11 through a read gate transistor 33. The signal charge accumulated in the PD 11 is read out to the VCCD 31 through the read gate transistor 33. The VCCD 31 transfers the signal charge in the vertical direction (a direction orthogonal to a paper plane in FIG. 1) to a horizontal transfer path (not shown). The element isolator 32 prevents the signal charge, read out from the PD 11, from flowing into the VCCD 31 of the adjacent column.

A p-well layer 35 is formed on the n-type semiconductor substrate 30. The PDs 11, the VCCDs 31, the element isolators 32, and the read gate transistors 33 are formed on the p-well layer 35. The CCD image sensor 10 is produced by forming the parts or sections over the n-type semiconductor substrate 30 using well-known techniques such as CVD (chemical vapor deposition), PVD (spattering, physical vapor deposition), doping, photolithography, or etching.

The PD 11 is constituted by forming an n-type layer on the p-well layer 35. The PD 11 generates electron-hole pairs in accordance with light incident on a p-n junction. The electrons are accumulated in the n-type layer. Note that a p-type layer may be formed on the n-type layer of the PD 11 to prevent dark current and white spots.

The VCCD 31 is composed of the n-type layer formed on the p-well layer 35. A transfer electrode 40 is provided over the VCCD 31. The read gate transistor 33 is composed of the p-type layer formed on the p-well layer 35. A transfer electrode 41 is provided over the read gate transistor 33. Each of the transfer electrodes 40 and 41 is made from low-resistance polysilicon, for example.

The signal charge accumulated in the PDs 11 is transferred to the VCCD 31 when electric potential of the read gate transistor 33 is changed by applying voltage to the transfer electrode 41. The signal charge transferred to the VCCD 31 is then transferred in the vertical direction when voltage is applied to the transfer electrode 40. Thereby, the signal charge, photoelectrically converted and accumulated in the PDs 11, is transferred from the VCCD 31 to the horizontal transfer path.

The element isolator 32 is provided between the PD 11 and the VCCD 31. The element isolator 32 is composed of a $p^+$ layer formed on the p-well layer 35. The element isolator 32 is a potential barrier with increased concentration of impurity of a conductive type opposite to the n-type layers constituting the PD 11 and the VCCD 31. Thereby, the element isolator 32 prevents the signal charge from flowing into another VCCD 31 corresponding to the adjacent PD 11.

A light shielding film 42 is provided over the p-well layer 35 formed with the transfer electrodes 40 and 41. The light shielding film 42 is formed to cover the entire of the VCCD 31, the element isolator 32, and the read gate transistor 33. The light shielding film 42 is provided with a plurality of openings 42a each exposing a light receiving area of the PD 11. Thereby, the light shielding film 42 prevents the light from being incident on areas other than the PDs 11. The light shielding film 42 is produced from tungsten, for example.

A planarizing layer 43 is provided over the light shielding film 42. The color filter 15 and the microlens 14 are provided over the planarizing layer 43. The planarizing layer 43 is filled over projections and depressions over the substrate caused by the transfer electrodes 40 and 41 and the like so as to make a flat surface on which the color filters 15 are formed. The planarizing layer 43 is made from a light transmissive material, for example, BPSG to which reflow treatment is applicable. Note that an in-layer lens (not shown) may be formed in the planarizing layer 43. The in-layer lens may be made from a material, for example, silicon nitride (SiN), with a refractive index higher than that of the planarizing layer 43. The in-layer lens may be convex-up or convex-down, or convex in both directions.

The color filter 15 has a thin-film shape and is formed over the planarizing layer 43. The color filter 15 is made from a polymer material called color resist. The microlens 14 is made from an organic thin film, silicon nitride (SiN), or the like. To form the microlenses 14, for example, a material film of SiN is formed over the color filters 15, and then resist is applied over the material film in accordance with an arrangement pattern of the pixel sets 16. The resist is melted by heat processing and formed into hemispheric shapes. The shape of the resist is transferred to the material film by anisotropic etching. Thus, the microlenses 14 are formed. Alternatively, an organic film over the color filters 15 may be melted by heat processing and formed into the hemispheric shapes to form the microlenses 14.

Figure 4:
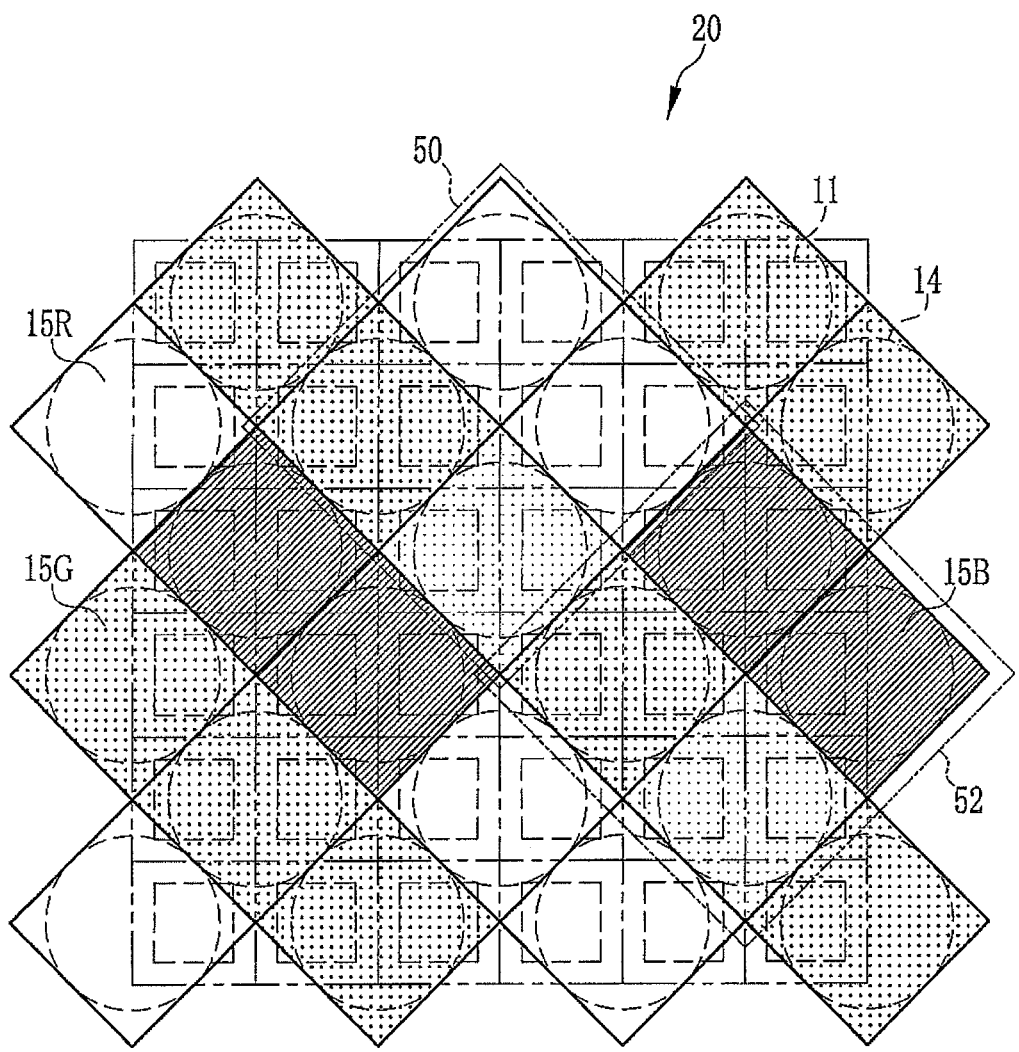
FIG. 4 is an explanatory view illustrating an arrangement of color filters of pixels.

As shown in FIG. 4, the color filters 15 are composed of red color filters 15R each transmitting red light, green color filters 15G each transmitting green light, and blue color filters 15B each transmitting blue light. The color filters (color filter segments) 15R, 15G, and 15B are provided to the respective pixel sets 16, so that the two pixels 12 and 13 in the pixel set 16 are of the same color. Note that in FIGS. 4, 5, and 10, a color filter with no hatching is the red color filter 15R. A color filter with dotted hatching is the green color filter 15G. A color filter with slanted hatching is the blue color filter 15B.

The color filters 15 are segmented (or classified) into first filter sets 50 and second filter sets 52. The first and second filter sets 50 and 52 are arranged in a checkered pattern. The first filter set 50 is composed of the two green color filters 15G and the two red color filters 15R. The two green color filters 15G are next to each other in a 45-degree oblique direction. The two red color filters 15R are next to each other in the 45-degree oblique direction and adjacent to the respective two green color filters 15G. The second filter set 52 is composed of the first filter set 50 with the red color filters 15R replaced by the blue color filters 15B.

In this arrangement of the color filters 15R, 15G, and 15B, there are rows each having the green color filters 15G arranged in the 45-degree oblique direction and rows each having pairs of the two red color filters 15R and pairs of the two blue color filters 15B arranged alternately in the 45-degree oblique direction. The row of the green color filters 15G and the row of the red and blue filters 15R and 15B are arranged alternately in a direction orthogonal to the 45-degree oblique direction. In a direction orthogonal to the 45-degree oblique direction, the red and the blue color filters 15R and 15B are disposed alternately, with the green color filter 15G in between.

The color filters 15 are arranged in a manner similar to those arranged in the so-called honeycomb pattern in a solid state imaging device. In the honeycomb pattern, the pixels are arranged adjacent to each other in the 45-degree oblique direction. One of the pair of the adjacent pixels has high sensitivity while the other has low sensitivity. The pixel values of the high and low sensitivity pixels are mixed to obtain an image with a wide dynamic range.

According to this embodiment, the area of the microlens 14 corresponding to each of the pixels 12 and 13 is twice the area of the conventional microlens. Accordingly, the sensitivities of the pixels are improved as compared with the case where the opening of the light shielding film is shifted.

The arrangement of the pixel sets 16 in this embodiment is suitable for obtaining an image with a wide dynamic range. For example, to obtain an image for the AF control of the phase difference method or to perform monocular 3D imaging to obtain a pair of images with binocular parallax, one of the pixels 12 and 13 is used as the high sensitivity pixel while the other is used as the low sensitivity pixel because the pixels 12 and 13 in the pixel set 16 are of the same color. Thereby, the dynamic ranges of the images are widened.

Figure 5:
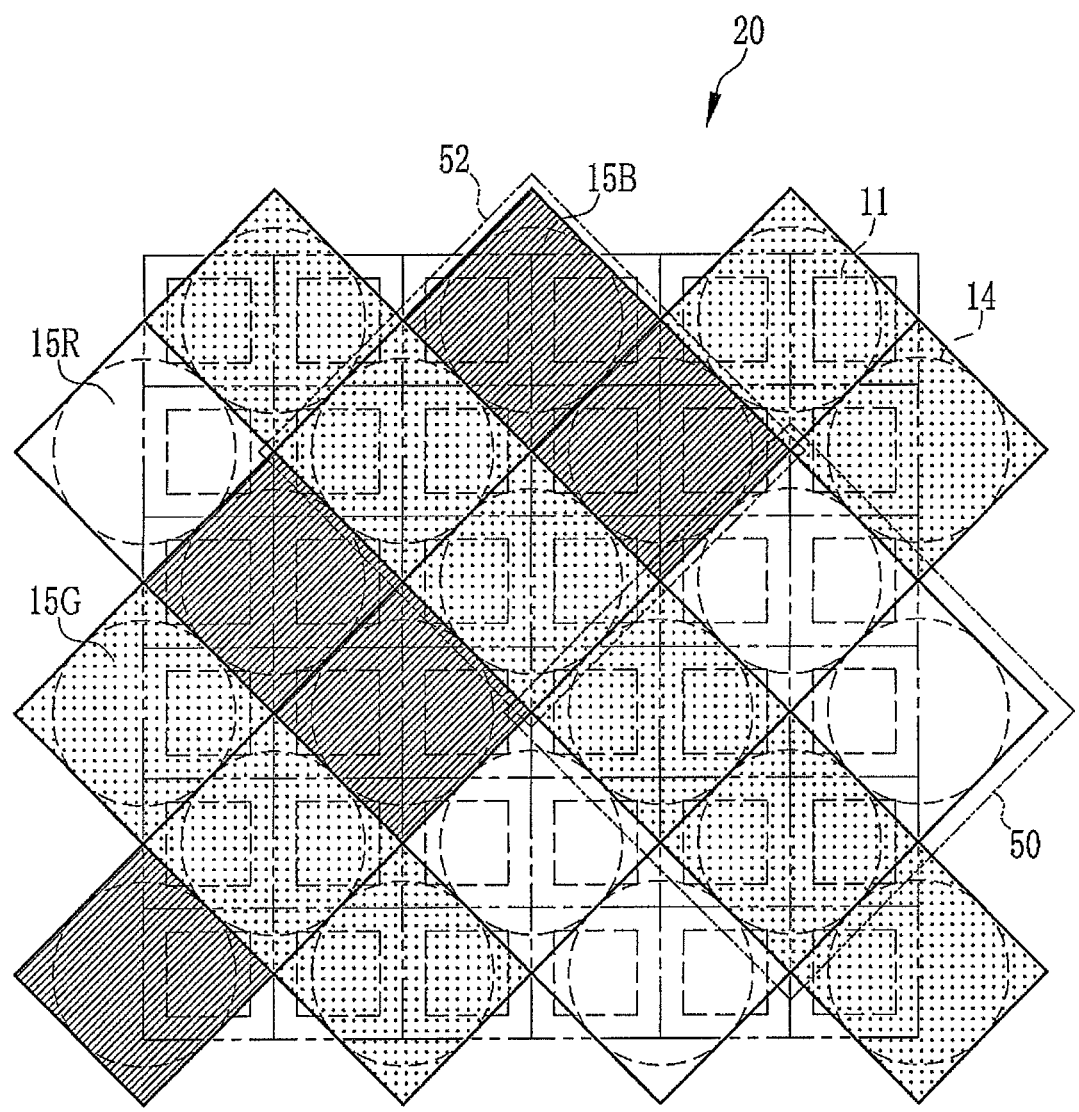
FIG. 5 is an explanatory view illustrating another arrangement of color filters.

In the above embodiment, the filter sets 50 and 52 are arranged in the checkered pattern. Alternatively, for example, as shown in FIG. 5, the filter sets 50 may be arranged in a direction orthogonal to the direction in which the color filters 15 of the same color are arranged. The filter sets 52 may be arranged in a direction orthogonal to the direction in which the color filters 15 of the same color are arranged. Thereby, the rows of the filter sets 50 and the rows of the filter sets 52 are arranged alternately in a stripe-like pattern. In this case, the color filters 15 of the same color, the red color filters 15R or the blue color filters 15B, are arranged successively, with the green color filter 15G in between, in a direction orthogonal to the row of the green color filters 15G arranged in the 45-degree oblique direction.

Figure 6:
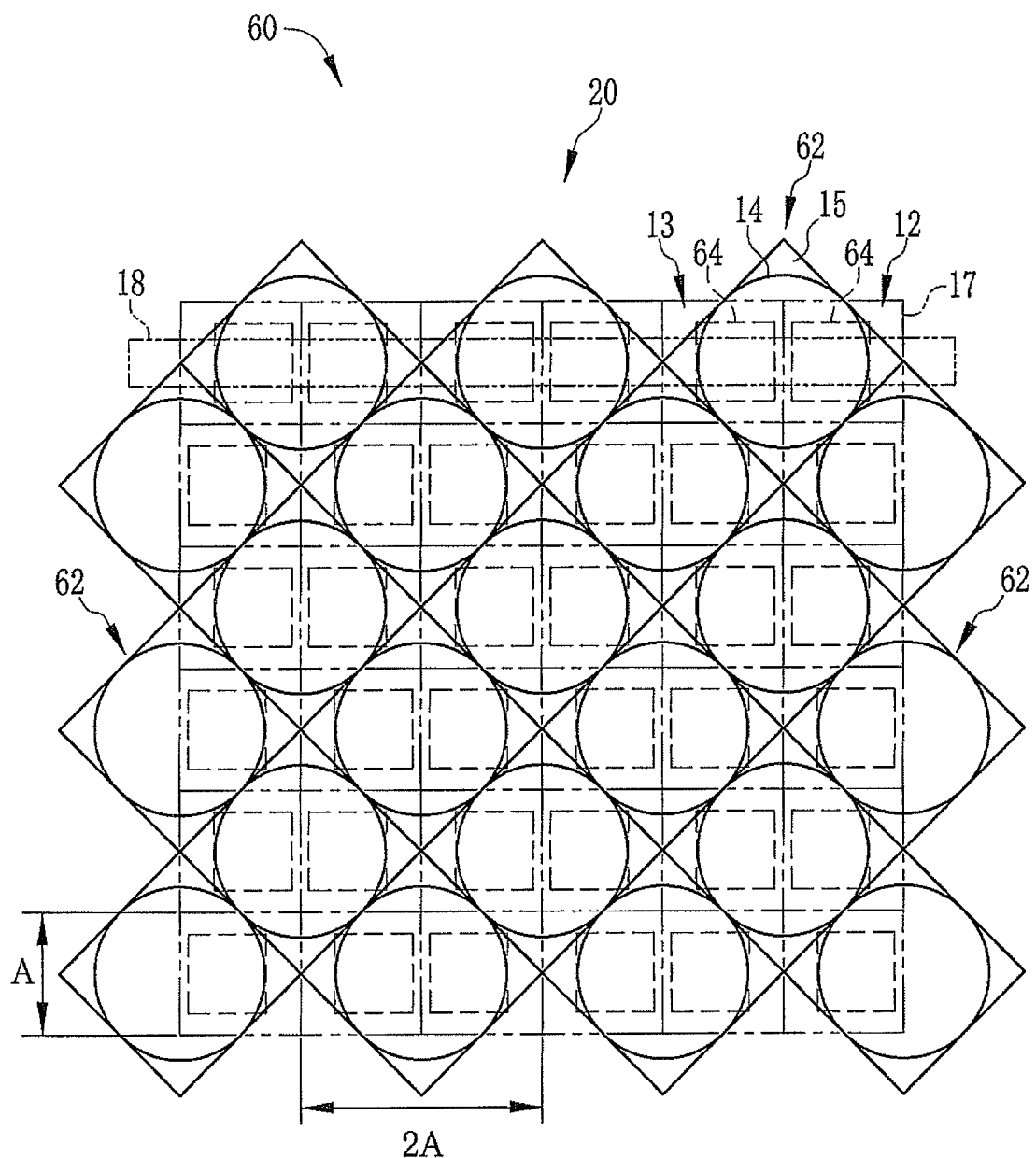
FIG. 6 is an explanatory view illustrating an arrangement in which the positions of the respective PDs are shifted toward the center of the color filter and the center of the microlens.

In the structure of the above embodiment, the sensitivity of the PD 11 increases as the PD 11 is closer to an area immediately below the center of the microlens 14. Hence, as shown by a pixel set 62 of a CCD image sensor 60 in FIG. 6, PDs 64 may be disposed closer to the center of the microlens 14.

Figure 7:
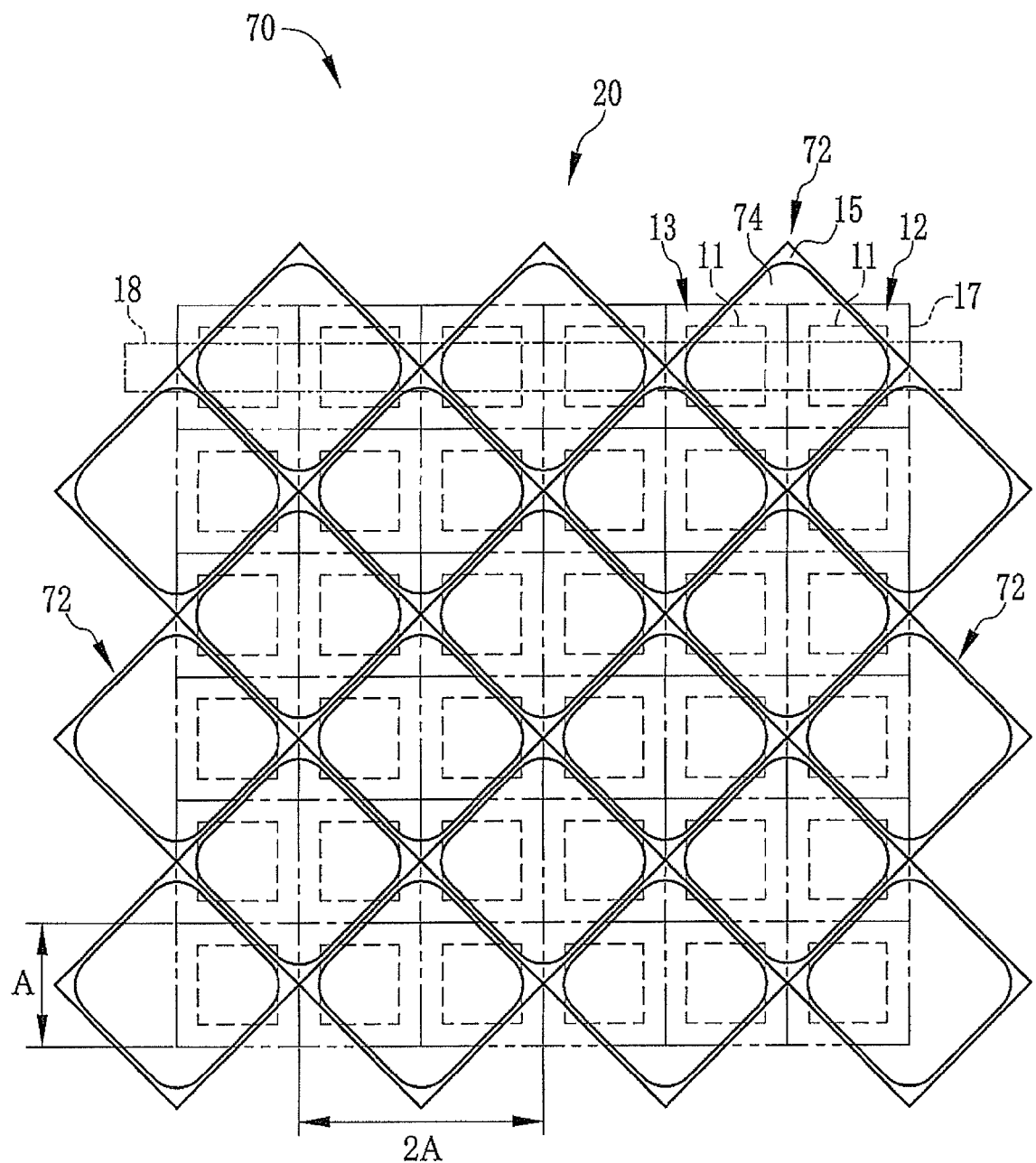
FIG. 7 is an explanatory view of an example in which square-shaped microlenses are used.

In the above embodiment, the microlens 14 has the hemispheric shape. Alternatively, for example, as shown by a pixel set 72 of a CCD image sensor 70 in FIG. 7, a microlens 74 may have a square external shape with a convex surface. To form the microlens 74, a lens with a hemispheric shape is deformed into a substantially square shape so as to have the size which allows the pixels 12 and 13 of the pixel set 72 to be arranged side by side. In other words, the bottom shape of the microlens 74 has a substantially square shape with a diagonal line of 2A. Thereby, an area of the microlens 74 is enlarged relative to that of the hemispheric lens. Accordingly, the sensitivities of the pixels 12 and 13 are improved.

Figure 8:
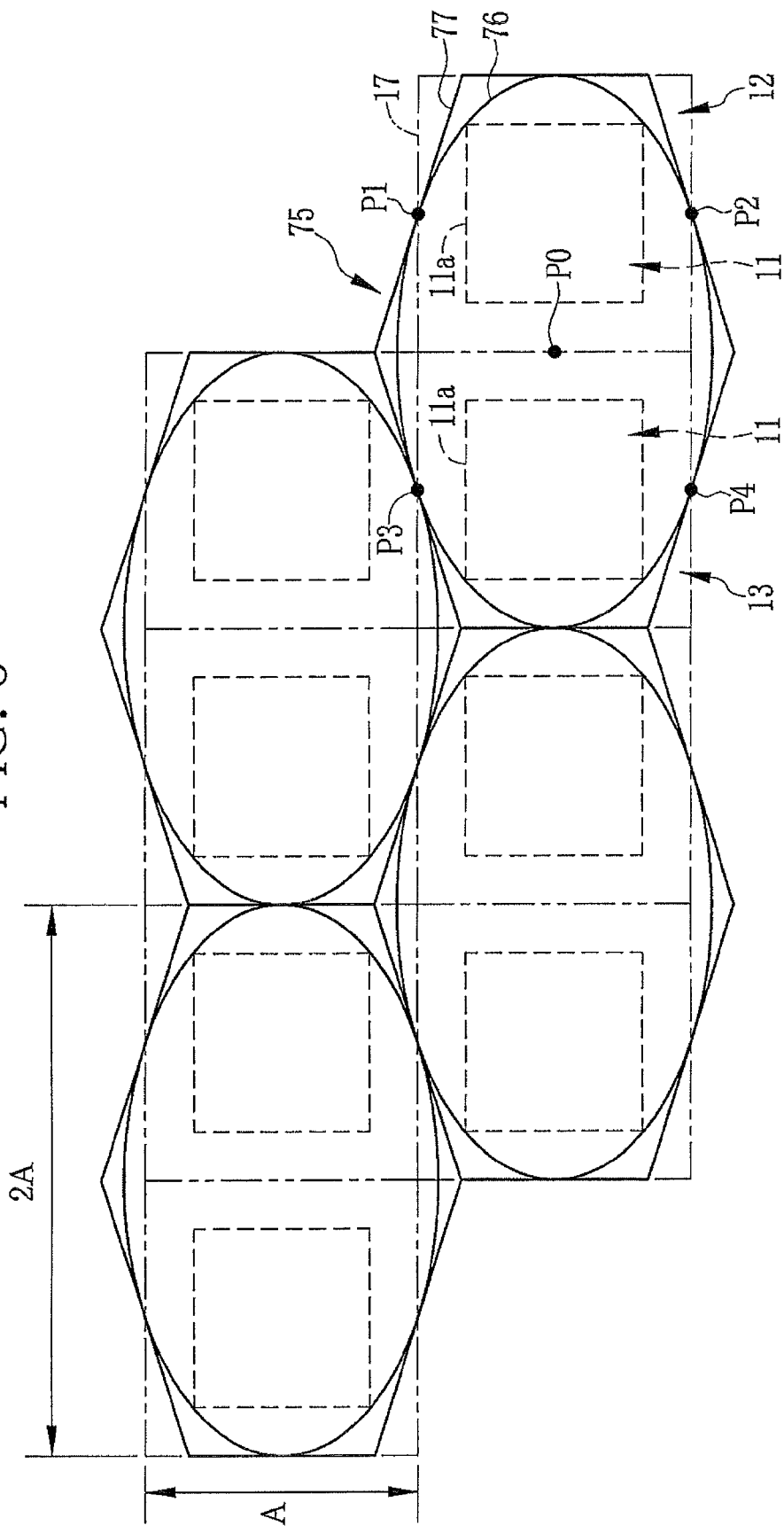
FIG. 8 is an explanatory view of an example in which semi-ellipsoidal microlenses are used.

As shown in FIG. 8, a microlens 76 of a pixel set 75 may have a semi-ellipsoidal shape. A bottom shape of the microlens 76 is elliptic with a major axis of 2A and a minor axis slightly longer than A. An optical axis of the microlens 76 is coincident with the center of the region 17. Thereby, one of apexes (edge portions) of the microlens 76 in the minor axis direction overlaps a space between a pair of adjacent microlenses 76 located vertically above or below.

A color filter (color filter segment) 77 has a hexagonal shape circumscribed to the elliptic shape of the bottom of the microlens 76. Thereby, the color filters 77 are arranged without any gap in the imaging surface even when the microlens 76 has the semi-ellipsoidal shape.

Coordinates of the nearest neighbor points P1, P2, P3, and P4 on each of the microlenses 76 adjacent to each other in the vertical direction are as follows: P1=(A/2,A/2); P2=(A/2,−A/2); P3=(−A/2,A/2); P4=(−A/2,−A/2); where A denotes a length of a side of a pixel, and the center P0 of the region 17 is the origin. The four points P1 to P4 are also the points of contact between the microlens 76 and the color filter 77. Note that, in FIG. 8, the microlens 76 has the hexagonal shape with pointed apexes. In actual manufacture, each of the apexes is rather rounded, so that the microlens 76 has a chamfered or rounded hexagonal shape.

When the rectangular color filter 15 and the hemispheric microlens 14 are used in combination, areas of corner portions of the color filter 15 uncovered by and extending beyond the microlens 14 are relatively large. Light incident obliquely on the uncovered corner portions may cause color mixing. On the other hand, when the semi-ellipsoidal microlens 76 and the hexagonal color filter 77 that is more nearly circular than the rectangular shape are used in combination, corner portions of the hexagonal color filter 77 uncovered by the semi-ellipsoidal microlens 76 are smaller than the corner portions of the rectangular color filter 15 uncovered by the hemispheric microlens 14. As a result, color mixing is prevented.

An area of the semi-ellipsoidal microlens 76 overlapping the pixels 12 and 13 is larger than an area of the hemispheric microlens 14 overlapping the pixels 12 and 13. As shown in FIG. 8, opening areas 11a of the light shielding film over the respective PDs 11 are entirely covered by the microlens 76 even if each of the opening areas 11a has a conventional rectangular shape. As a result, reduction in the sensitivities of the pixels 12 and 13 is prevented.

When each of the microlens 76 and the color filter 77 is long from side to side, and a ratio between the minor axis and the major axis is 1:2 similar to the height and width ratio of the pixel set 75, the maximum distance between an end of the opening area 11a and an end of the microlens 76 is shortened. Thereby, the light refracted by the microlens 76 is incident on the opening area 11a at a small angle of refraction. This is advantageous in terms of sensitivity. Thus, the microlens 76 long from side to side and the color filter 77 long from side to side are extremely suitable for a pixel structure for monocular 3D imaging or for obtaining a phase difference signal. The microlens 76 long from side to side has higher collection efficiency of light into the PD 11 than that of the hemispheric microlens.

Figure 9:
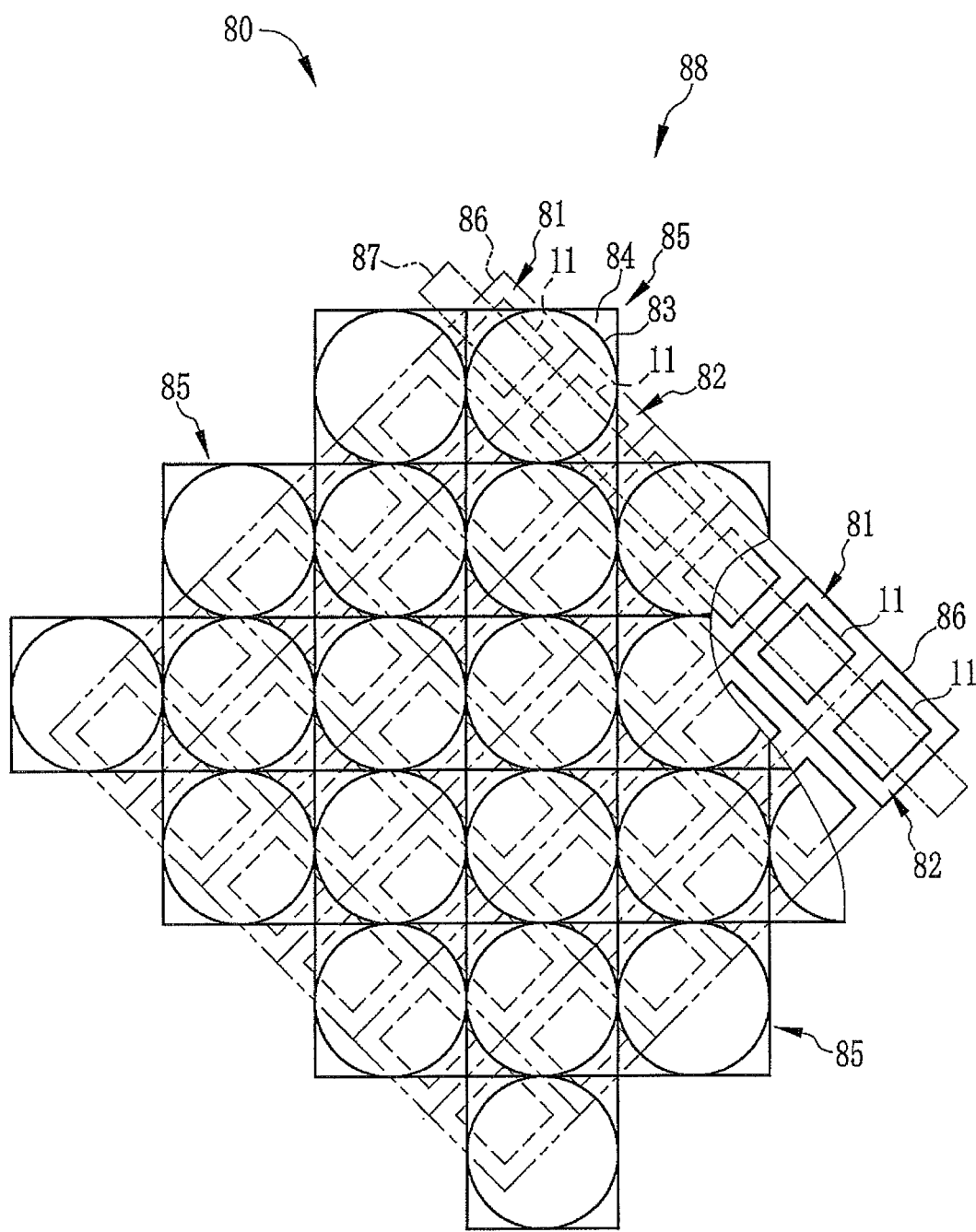
FIG. 9 is an explanatory view illustrating an example in which the pixels are arranged in a 45-degree oblique direction and the microlenses and the color filters are arranged in a simple square lattice pattern.

In the embodiments shown in FIGS. 2 to 7, the pixels 12 and 13 are arranged in the simple square lattice pattern, and the microlenses 14 and the color filters 15 are arranged in the honeycomb pattern. Alternatively, a CCD image sensor 80 may be configured as shown in FIG. 9.

The CCD image sensor 80 is provided with a plurality of pixel sets 85. Each pixel set 85 is composed of two pixels, first and second pixels 81 and 82 with respective PDs 11, a microlens 83, and a color filter 84. Each of the pixels 81 and 82 has a square shape rotated by 45 degrees. The pixels 81 and 82 are arranged side by side in the 45-degree oblique direction. The microlens 83 is similar to the microlens 14 of the above embodiment. The color filter 84 has a square shape. The center of the color filter 84 is coincident with an optical axis of the microlens 83.

In the CCD image sensor 80, a longitudinal direction of a region 86 having the adjacent pixels 81 and 82 is parallel with the 45-degree oblique direction. A pixel row 87 is composed of the pixel sets 85 arranged in the longitudinal direction. In the CCD image sensor 80, the pixels rows 87 are arranged in a direction orthogonal to the longitudinal direction of the region 86. The adjacent pixels rows 87 are shifted from each other by half the region 86 in the longitudinal direction to prevent the pixels of the same type (the first pixels 81 or the second pixels 82) from being adjacent to each other in the adjacent pixel row 87. Thus, a rectangular imaging surface 88 is configured.

In the CCD image sensor 80, the pixel sets 85 are arranged to configure the imaging surface 88. The pixels 81 and 82 are arranged in the 45-degree oblique direction. The microlenses 83 and the color filters 84 are arranged in the simple square lattice pattern. This configuration also improves the sensitivities of the pixels 81 and 82, being the phase difference detection pixels, in a manner similar to the above embodiments. Note that the configuration of the CCD image sensor 80 may be regarded as the configuration of the CCD image sensor 10 rotated by approximately 45 degrees.

Figure 10:
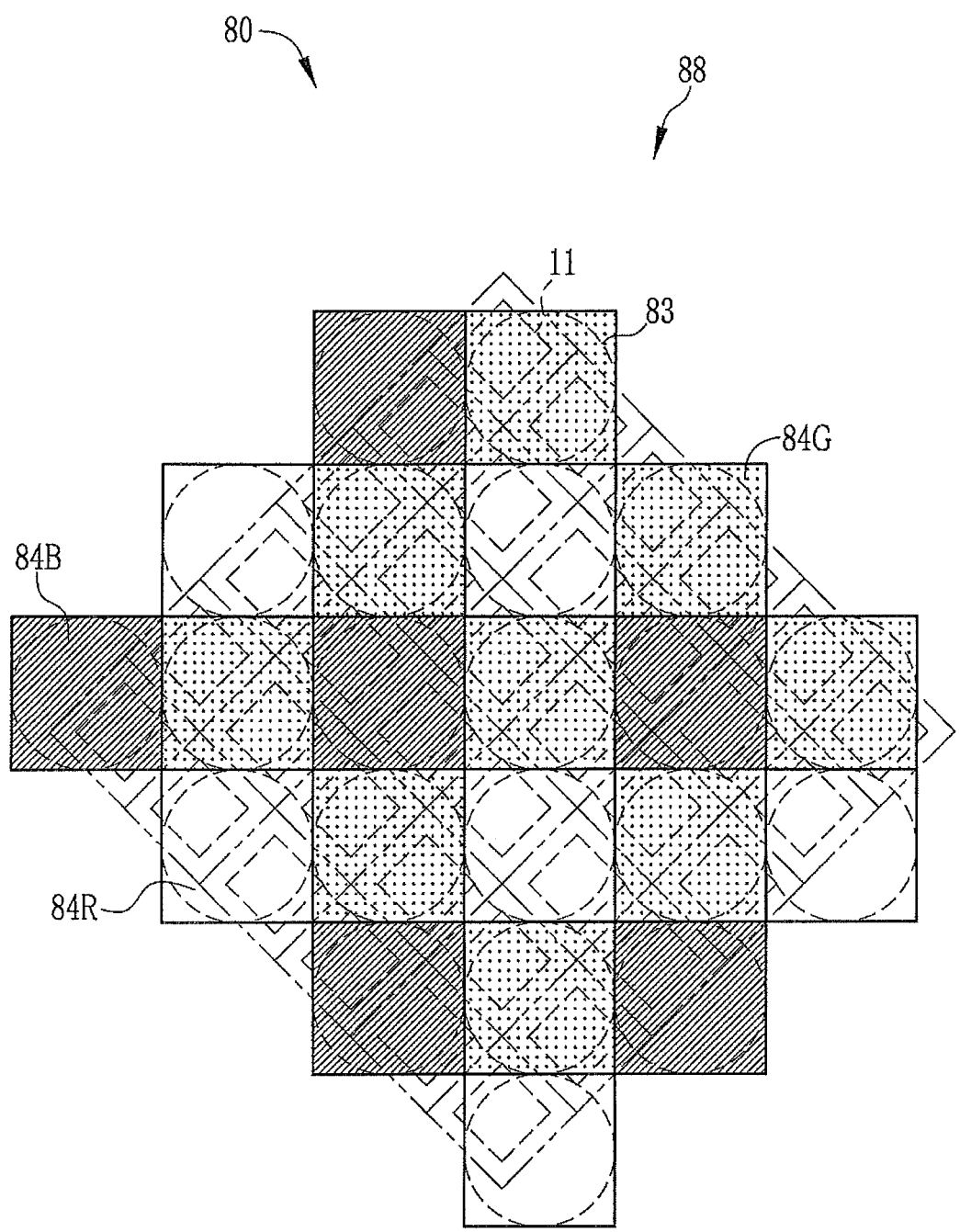
FIG. 10 is an explanatory view of an example in which the color filters are arranged in a Bayer pattern.

As shown in FIG. 10, in the CCD image sensor 80, it is preferable to arrange red, green, and blue color filters (color filter segments) 84R, 84G, and 84B in the so-called Bayer pattern. In the Bayer pattern, the color filters 84R, 84G, and 84B are arranged in units of four color filters in a 2×2 lattice in the pixel sets 85. Each unit of four color filters is composed of the two obliquely arranged green color filters 84G, the red color filter 84R, and the blue color filter 84B.

In the CCD image sensor 80, the PD 11 has the maximum sensitivity when the light is incident not from rightward and leftward directions but from an oblique direction. To be more specific, in the first pixel 81 located in an upper left oblique direction relative to the optical axis of the microlens 83, the sensitivity to the light incident from a lower right oblique direction reaches a maximum value. In the second pixel 82 located in the lower right oblique direction relative to the optical axis of the microlens 83, the sensitivity to the light incident from the upper left oblique direction reaches a maximum value. Hence, the sensitivities of the first and second pixels 81 and 82 to the light from the rightward and leftward directions, which are necessary for producing parallax images, may be reduced as compared with the case where the pixels are arranged in the simple square lattice pattern.

Figure 11:
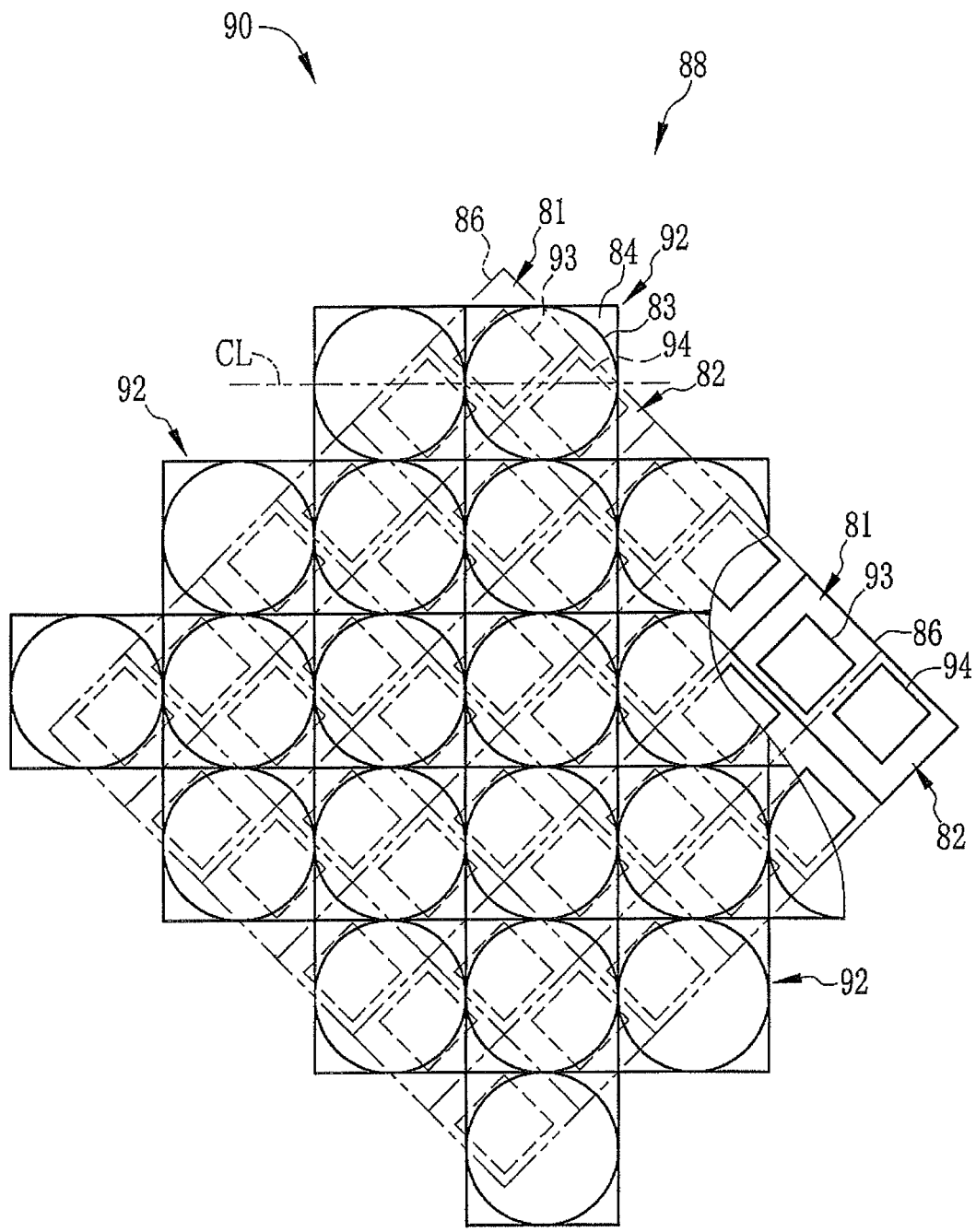
FIG. 11 is an explanatory view of an example in which the positions of the respective PDs are shifted toward a center line of the color filter and the microlens in a right-left direction.

To solve the problem, in a pixel set 92 of a CCD image sensor 90 shown in FIG. 11, a PD 93 of the first pixel 81 is shifted in a downward direction, and a PD 94 of the second pixel 82 is shifted in an upward direction. Thereby, the centers of the respective PDs 93 and 94 become closer to a center line CL of the color filter 84 and microlens 83 in the right-left direction, and thus the directions of the incident angles of the incident light to which the PDs 93 and 94 are most sensitive are shifted to the rightward and leftward directions. Hence, the sensitivities to the light incident from the rightward and leftward directions, which are necessary for producing the parallax images, are increased. When the PDs 93 and 94 are shifted as described above, the whole of each of the PDs 93 and 94 becomes closer to the optical axis of the microlens 83. As a result, not only the sensitivities to the light from the rightward and leftward directions, but also the overall sensitivities of the pixels 81 and 82 are increased.

Note that each of the PDs 93 and 94 may be shifted in any direction as long as the center of each of the PDs 93 and 94 becomes closer to the center line CL. In the case where the pixels 81 and 82 are arranged in the 45-degree oblique direction, and the first pixel 81 is located in the upper left oblique direction relative to the optical axis of the microlens 83, and the second pixel 82 is located in the lower right oblique direction relative to the optical axis of the microlens 83, the center of each of the PD 93 of the first pixel 81 and the PD 94 of the second pixel 82 becomes closest to the center line CL when the PD 93 is shifted downward and the PD 94 is shifted upward. Hence, it is suitable to shift the PDs 93 and 94 in the up-down direction as described above.

Note that when each of the PDs 93 and 94 is shifted, each of the PDs 93 and 94 is rotationally symmetric with respect to the center of the region 86 in the longitudinal direction. In the above embodiments, each of the PDs 11 is line-symmetric by way of example. The pixels 81 and 82 function properly as the phase difference detection pixels even if each of the PDs 93 and 94 is rotationally symmetric.

In the above embodiments, each of the pixels 12 and 13 has the square shape. The two pixels 12 and 13 are disposed in the rectangular region 17, with the height and width ratio of approximately 1:2, over the semiconductor substrate by way of example. The number of the pixels in the pixel set 16 is not limited to two.

Figure 12:
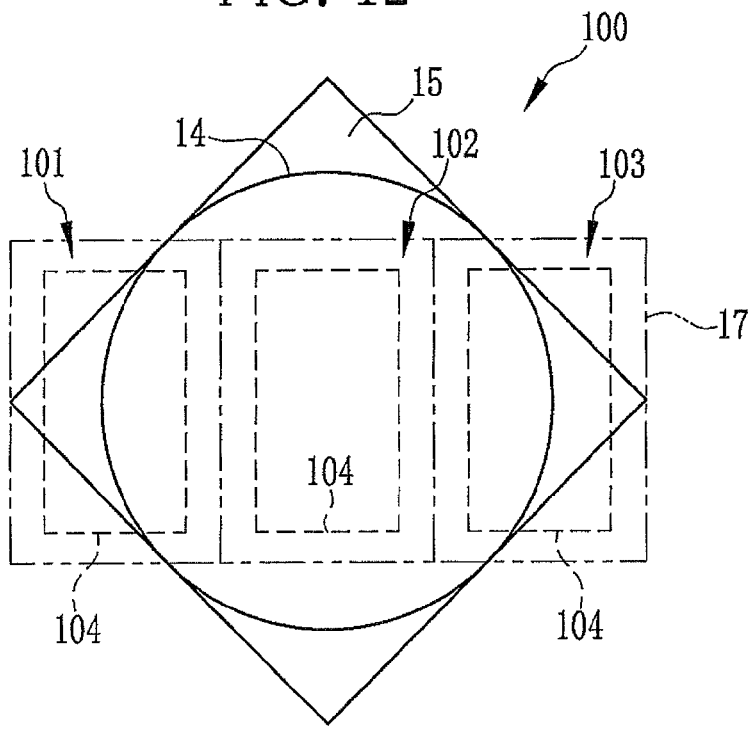
FIG. 12 is an explanatory view of an example of a pixel set having three pixels.

For example, in a pixel set 100 shown in FIG. 12, three pixels, a first pixel 101, a second pixel 102, and a third pixel 103, of the same rectangular shape are arranged in a longitudinal direction of the region 17. The pixels 101 to 103 are provided with respective PDs 104 of the same rectangular shape. The centers of the PDs 104 are coincident with the centers of the pixels 101 to 103, respectively.

Hence, each of the PDs 104 is line-symmetric with respect to the center of the region 17 in the longitudinal direction. The center of the PD 104 of the second pixel 102 in the middle of the pixels 101 to 103 is coincident with the optical axis of the microlens 14. With the use of the pixel set 100 having three pixels, first to third pixels 101 to 103, three pieces of phase difference data are obtained from the respective pixels 101 to 103. The more the phase difference data is obtained, the higher the detection accuracy of the phase difference AF becomes.

Figure 13:
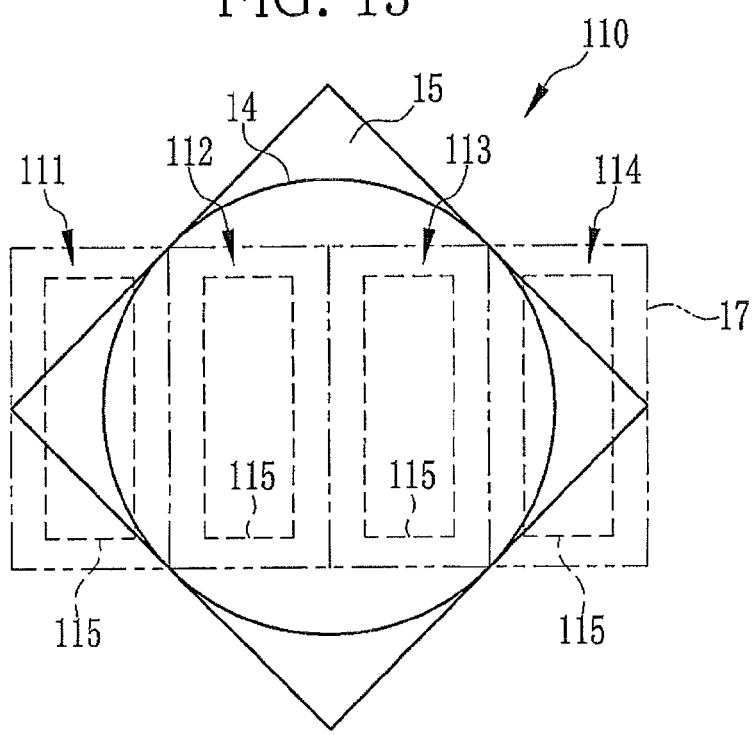
FIG. 13 is an explanatory view of an example of a pixel set having four pixels.

In a pixel set 110 shown in FIG. 13, four pixels, first to fourth pixels 111, 112, 113, and 114 of the same rectangular shape are arranged in a longitudinal direction of the region 17. The pixels 111, 112, 113, and 114 are provided with respective PDs 115 of substantially the same rectangular shape. The centers of the PDs 115 are coincident with the centers of the pixels 111, 112, 113, and 114, respectively. Hence, each of the PDs 115 is line-symmetric with respect to the center of the region 17 in the longitudinal direction. With the use of the pixel set 110, four pieces of phase difference data are obtained from the respective pixels 111 to 114. This further improves the detection accuracy of the phase difference AF.

Figure 14:
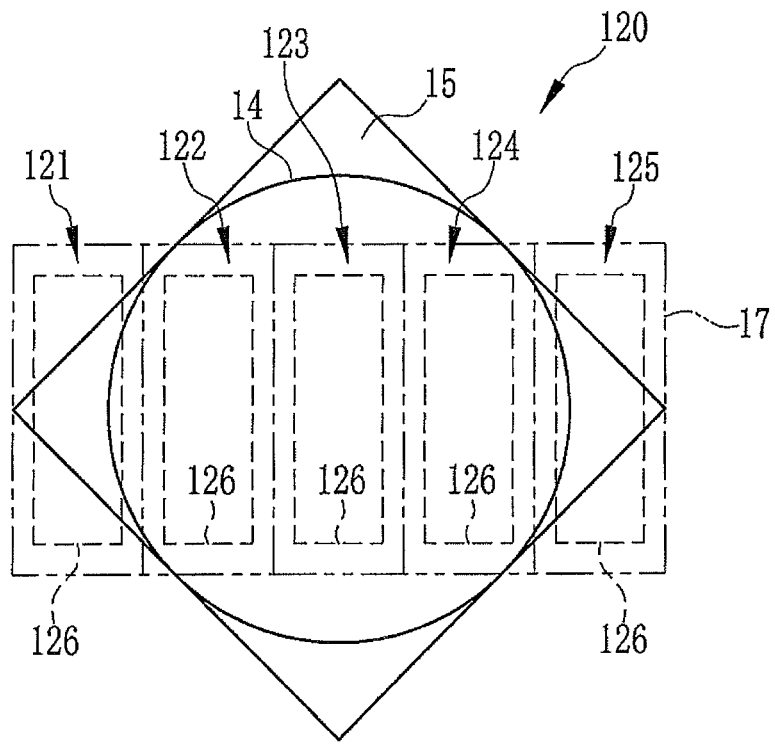
FIG. 14 is an explanatory view of an example of a pixel set having five pixels.

In a pixel set 120 shown in FIG. 14, five pixels, first to fifth pixels 121, 122, 123, 124, and 125 of the same rectangular shape are arranged in a longitudinal direction of the region 17. The pixel set 120 is similar to the pixel set 110 containing four pixels shown in FIG. 13 except that the pixel set 120 contains the five pixels, so that the description of the pixel set 120 is omitted.

Figure 15:
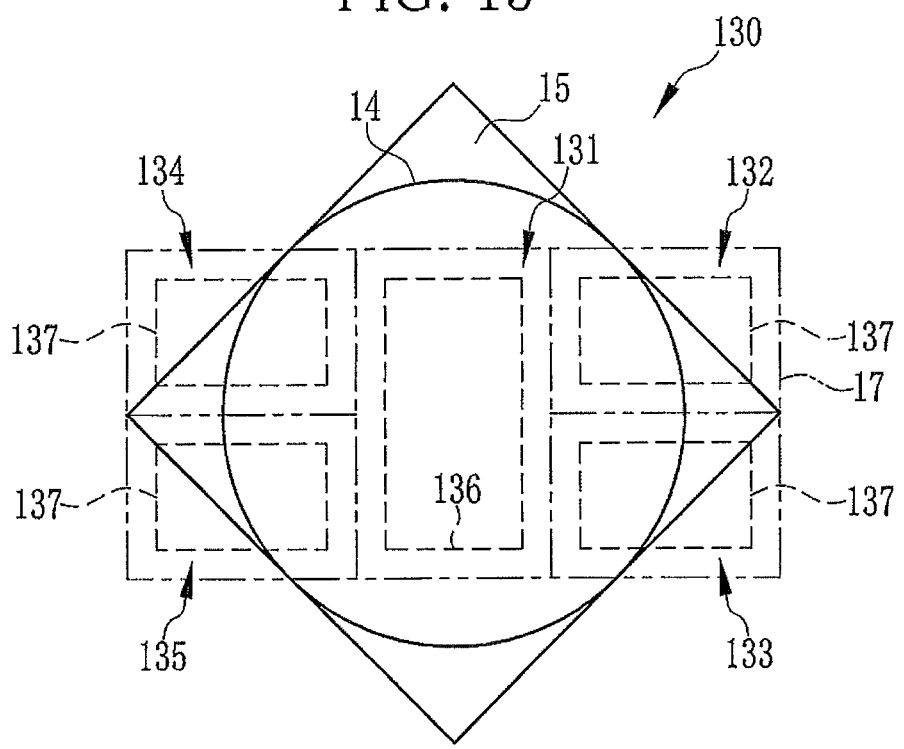
FIG. 15 is an explanatory view of an example of a pixel set having five pixels of different sizes.

A pixel set 130 shown in FIG. 15 is provided with five pixels, first to fifth pixels 131 to 135. The first pixel 131 is disposed in the middle. The second pixel 132 and the third pixel 133 are arranged in two rows, top-and-bottom, on the right side of the first pixel 131. The fourth pixel 134 and the fifth pixel 135 are arranged in two rows, top-and-bottom, on the left side of the first pixel 131.

The first pixel 131 has a substantially rectangular shape. The center of the first pixel 131 is substantially coincident with the center of the region 17. A right side portion of the first pixel 131 of the region 17 is divided into two parts in the up-down direction to form the second pixel 132 and the third pixel 133. In a similar manner, a left side portion of the first pixel 131 of the region 17 is divided into two parts in the up-down direction to form the forth pixel 134 and the fifth pixel 135.

A rectangular PD 136 is provided in the first pixel 131. The center of the PD 136 is coincident with the center of the first pixel 131 and the optical axis of the microlens 14. The second to fifth pixels 132 to 135 have respective PDs 137 of the same rectangular shape. The PDs 137 are coincident with the centers of the pixels 132 to 135, respectively.

Note that the pixels 131 to 135 in the pixel set 130 may have different shapes. The PDs 136 and 137 in the pixel set 130 may have different shapes. However, each of the pixels 131 to 135 and the PDs 136 and 137 needs to be line-symmetric or rotationally symmetric with respect to the center of the region 17 in the longitudinal direction.

An amount of light collected by the microlens 14 is highest around the optical axis. Hence, the sensitivity of each of the pixel sets 100, 120, and 130 with the PD crossing the optical axis of the microlens 14 is higher than the sensitivity of each of the pixel sets 16 and 110 with the PDs not crossing the optical axis of the microlens 14.

In each of the above embodiments, the CCD image sensor is used. Alternatively, the present invention is applied to another type of solid state imaging device, such as a CMOS image sensor. In particular, in a back-illuminated type CMOS image sensor, an area of each of the openings can be enlarged. A distance between the microlens 14 and the PD 11 of each of the pixels 12 and 13 and a distance between the color filter 15 and the PD 11 of each of the pixels 12 and 13 can be increased so as to increase an amount of shift of an image relative to the focus point or to narrow a parallax angle while sensitivity reduction is prevented. Hence, the present invention is suitable for optimizing the phase difference characteristics.

In a normal CMOS image sensor, a metal wiring layer is formed below a microlens. A PD is formed below the wiring layer. In the back-illuminated type CMOS image sensor, on the other hand, the PD is formed below the microlens. The wiring layer is formed below the PD. In other words, in the back-illuminated type CMOS image sensor, the wiring layer and the PD are arranged in the reverse order from those in the normal CMOS image sensor.

Manufacturers of the solid state imaging devices each with the pixels (the pixel refers to a portion below the color filter) arranged in a simple square lattice pattern like the CCD image sensor 10 are greater in number than manufacturers of the solid state imaging devices each with the pixels arranged in the 45-degree oblique direction like the CCD image sensor 80. Accordingly, a quantity of production of the simple square lattice pattern type solid state imaging devices is much greater than that of the 45-degree oblique direction type solid state imaging devices. Hence, the simple square lattice pattern type solid state imaging devices are superior to the 45-degree oblique direction type solid state imaging devices in accumulation of techniques and know-how, and sufficiency of manufacturing facilities. In this specification, the configurations of the pixels arranged in the simple square lattice pattern and the configurations of the pixels arranged in the 45-degree oblique direction are described. In view of development and expansion of the phase difference AF and 3D technology, the configurations of the pixels in the simple square lattice pattern are superior to the configurations of the pixels in the 45-degree oblique direction.

Figure 16:
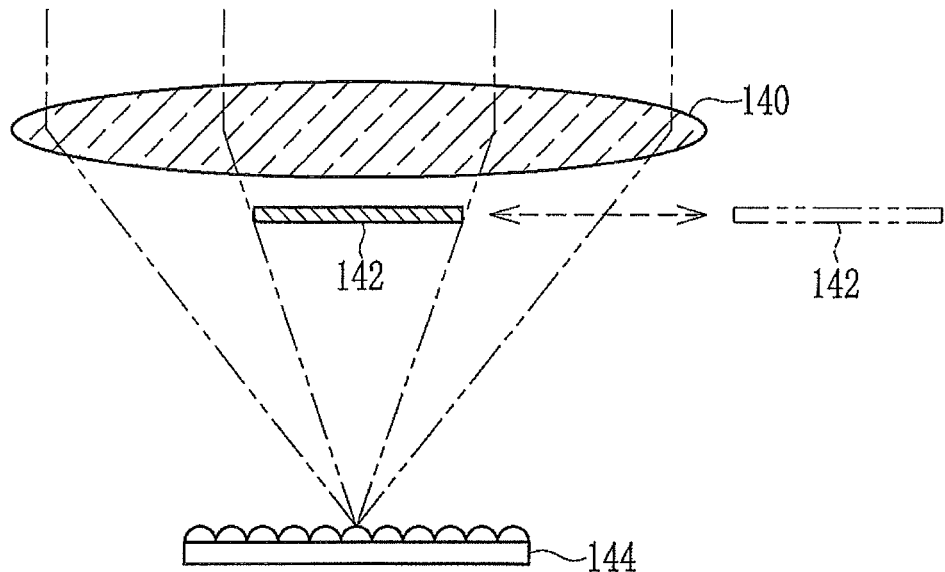
FIG. 16 is an explanatory view of an example in which a stop plate is provided in a pupil position.

Light incident areas in the pixel set are separated from each other by physically separating the PDs 11 from each other or by placing the openings of the light shielding film apart from each other. Alternatively, as shown in FIG. 16, a shield plate (stop plate) 142 may be disposed behind a pupil lens 140 to separate the light incident areas.

Figure 17:
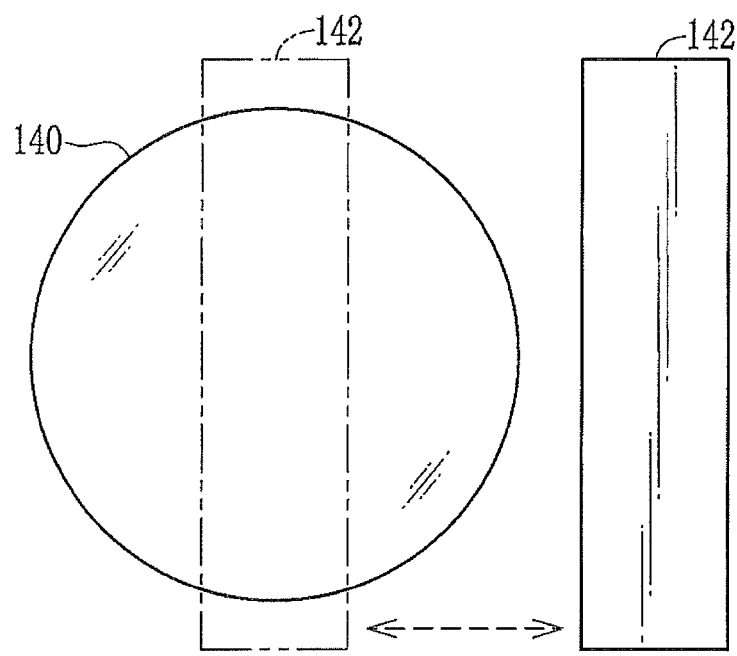
FIG. 17 is an explanatory view illustrating another configuration of a stop plate.

As shown in FIG. 17, the shield plate 142 has a rectangular shape with a long side longer than a diameter of the pupil lens 140 and with a short side shorter than the diameter of the pupil lens 140. A moving mechanism (not shown) moves the shield plate 142 between a light shielding position (a position shown by a solid line in FIG. 16) and a retracted position (a position shown by a two-dot chain line in FIG. 16). In the light shielding position, the shield plate 142 blocks the light passed through the middle of the pupil lens 140. In the retracted position, the shield plate 142 is retracted from the pupil lens 140.

Figure 18:
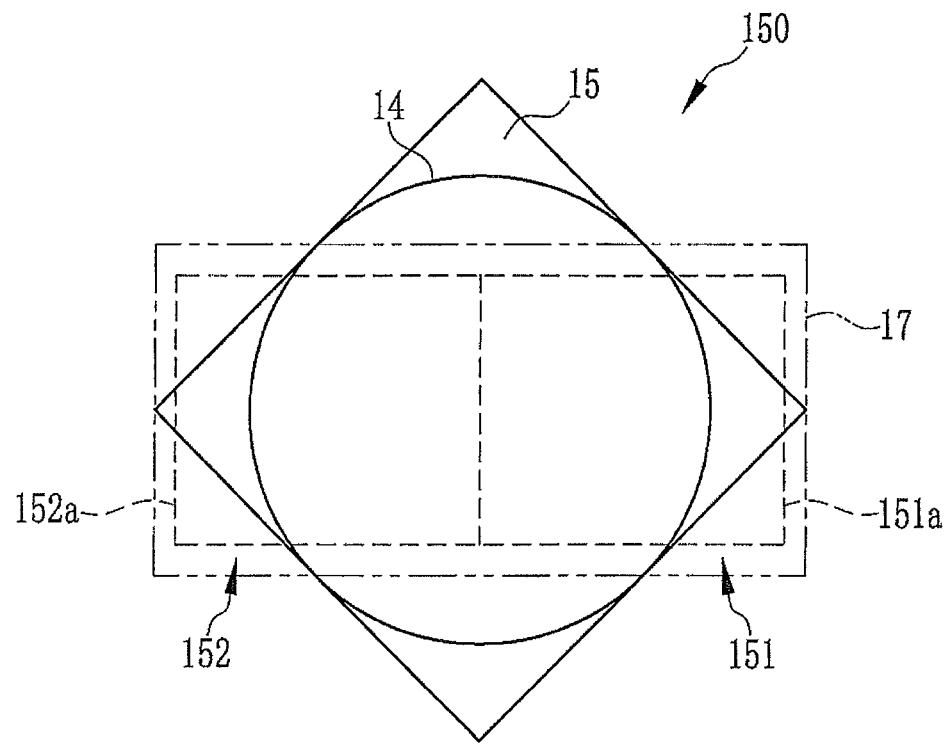
FIG. 18 is an explanatory view illustrating a configuration of a pixel set of a back-illuminated type solid state imaging device.

The pupil lens 140 and the shield plate 142 are preferably used in a back-illuminated type solid state imaging device 144. As shown in FIG. 18, in a pixel set 150 of the back-illuminated type solid state imaging device 144, the light shielding film is unnecessary between a PD 151a of a first pixel 151 and a PD 152a of a second pixel 152. Substantially the entire of the pixel set 150 is sensitive.

Figure 19:
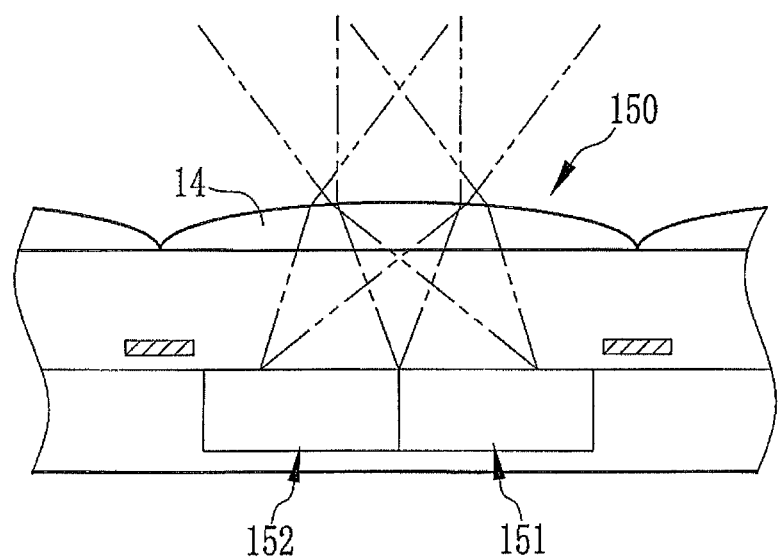
FIG. 19 is an explanatory view illustrating light incident on the solid state imaging device of FIG. 17 by way of example.

As shown in FIG. 19, when the shield plate 142 is in the retracted position, light passed through a left portion of the pupil lens 140 is incident on the first pixel 151 of the pixel set 150. Light passed through a right portion of the pupil lens 140 is incident on the second pixel 152 of the pixel set 150. The light passed through the middle of the pupil lens 140 is incident on both the pixels 151 and 152 of the pixel set 150.

When the shield plate 142 is in the light shielding position, the light passed through the middle of the pupil lens 140 is blocked by the shield plate 142. Hence, only the light passed through the left portion of the pupil lens 140 is incident on the first pixel 151. Only the light passed through the right portion of the pupil lens 140 is incident on the second pixel 152.

Hence, 2D imaging is performed by placing the shield plate 142 in the retracted position and adding the pixel values of the pixels 151 and 152 of the pixel set 150 together. 3D imaging is performed by placing the shield plate 142 in the light shielding position and obtaining an image from the first pixels 151 and an image from the second pixels 152. A parallax angle (base length), being an important index in the 3D imaging, is adjusted by changing the length of the short side of the shield plate 142. As described above, the light passed through the middle of the pupil lens 140 is blocked or transmitted with the combined use of the back-illuminated type solid state imaging device 144 and the shield plate 142. Thereby, the monocular 3D function is switched to the 2D function and vice versa.

Various changes and modifications are possible in the present invention and may be understood to be within the present invention.

What is claimed is:

1. A solid state imaging device comprising:
    a plurality of pixel sets, each including N (N is an integer greater than or equal to two) pixels and a microlens, the each pixel having a photoelectric converter for accumulating charge in accordance with incident light, the microlens condensing light into each of the N pixels, the N pixels being arranged in a rectangular region with a height and width ratio of approximately 1:2 such that the each photoelectric converter is line-symmetric or rotationally symmetric with respect to a center of the rectangular region in a width direction, an optical axis of the microlens being substantially coincident with the center of the rectangular region, size of the microlens being larger than a length of the rectangular region in a height direction and smaller than a length of the rectangular region in a width direction;
    pixel rows each composed of the pixel sets arranged in the width direction; and
    an imaging surface in which the pixel rows are arranged in the height direction, the adjacent pixel rows being shifted from each other by half the rectangular region in the width direction, a portion of the microlens extending beyond the rectangular region overlapping a space between the two microlenses of the two adjacent pixel sets in the adjacent pixel row.

2. The solid state imaging device of claim 1, wherein the pixel rows extend in a horizontal direction of the imaging surface and the microlenses are arranged in a 45-degree oblique direction.

3. The solid state imaging device of claim 2, wherein the each pixel set has a color filter, and the color filters are arranged adjacent to each other in the 45-degree oblique direction in the imaging surface in a manner similar to the microlenses.

4. The solid state imaging device of claim 3, wherein the color filters include red color filters for transmitting red light, green color filters for transmitting green light, and blue color filters for transmitting blue light, and the color filters of three colors are classified into first filter sets and second filter sets, and the each first filter set is composed of the two green color filters arranged adjacent to each other in the 45-degree oblique direction and the two red color filters arranged adjacent to each other in the 45-degree oblique direction and adjacent to the respective green color filters, and the each second filter set is composed of the first filter set with the red color filters replaced by the blue color filters, and the first and second filter sets are arranged in a checkered pattern in the imaging surface.

5. The solid state imaging device of claim 4, wherein the color filter has a square shape rotated by approximately 45 degrees, and a diagonal line of the square shape is approximately equivalent to the length of the rectangular region in the width direction, and a center of the color filter is coincident with the optical axis of the microlens.

6. The solid state imaging device of claim 5, wherein the N is two, and the each pixel has a square shape, and the pixels are arranged adjacent to each other in the horizontal and vertical directions in a simple square lattice pattern in the imaging surface.

7. The solid state imaging device of claim 1, wherein the pixel rows extend in a 45-degree oblique direction of the imaging surface, and the microlenses are arranged adjacent to each other in horizontal and vertical directions.

8. The solid state imaging device of claim 7, wherein the N is two, and the two pixels each having a square shape are arranged adjacent to each other in the 45-degree oblique direction.

9. The solid state imaging device of claim 8, wherein the photoelectric converter of the each pixel in the pixel set or an opening of a light shielding film of the each pixel is shifted close to a center of the microlens.

10. The solid state imaging device of claim 1, wherein the N is 3 to 5, and the pixel rows extend in the width direction of the rectangular region.

11. The solid state imaging device of claim 1, wherein the N pixels are first to fifth pixels, and the first pixel is disposed in the middle of the rectangular region, and the second and third pixels are arranged in two rows, top-and-bottom, on a right side of the first pixel, and the fourth and fifth pixels are arranged in two rows, top-and-bottom, on a left side of the first pixel.

12. The solid state imaging device of claim 1, wherein the microlens has a substantially hemispheric shape with a diameter of $\sqrt{2}A$ where the length of the rectangular region in the height direction is A.

13. The solid state imaging device of claim 1, wherein the microlens has a convex surface with a substantially square external shape.

14. The solid state imaging device of claim 1, wherein the microlens has a semi-ellipsoidal shape whose length of a major axis is substantially equal to a length of the pixel set in the width direction, and the optical axis of the microlens is substantially coincident with the center of the rectangular region.

* * * * *